(12) United States Patent
Petit et al.

(10) Patent No.: US 7,032,305 B2
(45) Date of Patent: Apr. 25, 2006

(54) METHOD FOR MOUNTING INTEGRATED CIRCUITS ON A PRINTED CIRCUIT CARD

(75) Inventors: Claude Petit, Villebon sur Yvette (FR); Thierry Fromont, Massy (FR)

(73) Assignee: Bull, S.A., Louviennes (FR)

( * ) Notice: Subject to any disclaimer, the term of this patent is extended or adjusted under 35 U.S.C. 154(b) by 0 days.

(21) Appl. No.: 10/692,862

(22) Filed: Oct. 27, 2003

(65) Prior Publication Data

US 2004/0085736 A1    May 6, 2004

Related U.S. Application Data

(62) Division of application No. 10/173,751, filed on Jun. 19, 2002, now Pat. No. 6,680,848.

(30) Foreign Application Priority Data

Jun. 19, 2001 (FR) .................................. 01 08008

(51) Int. Cl.
*H05K 3/30* (2006.01)
(52) U.S. Cl. ............................. 29/832; 29/829; 29/834; 361/704; 361/707; 257/718
(58) Field of Classification Search .......... 29/832–834, 29/593, 830, 829, 846, 847, 729, 739, 744; 439/331, 69; 361/704–710; 257/718–719
See application file for complete search history.

(56) References Cited

U.S. PATENT DOCUMENTS

| 4,159,483 | A  |   | 6/1979  | Bettin |
| 4,395,084 | A  | * | 7/1983  | Conrad .......................... 29/884 |
| 4,699,593 | A  | * | 10/1987 | Grabbe et al. ................. 439/71 |
| 5,473,510 | A  | * | 12/1995 | Dozier, II .................... 361/719 |
| 5,730,210 | A  |   | 3/1998  | Kou |
| 6,154,365 | A  |   | 11/2000 | Chia-Pin et al. |
| 6,490,161 | B1 | * | 12/2002 | Johnson ....................... 361/704 |
| 6,545,879 | B1 | * | 4/2003  | Goodwin ...................... 361/807 |
| 6,680,848 | B1 | * | 1/2004  | Petit et al. ................... 361/704 |
| 6,746,261 | B1 | * | 6/2004  | Petit et al. ................... 439/331 |

FOREIGN PATENT DOCUMENTS

EP    0 706 313 A    4/1996

* cited by examiner

*Primary Examiner*—Minh Trinh
(74) *Attorney, Agent, or Firm*—Miles & Stockbridge P.C.; Edward J. Kondracki

(57) ABSTRACT

A method of mounting electrical component assemblies on opposite sides of a printed circuit card including inserting a chock on a first side of the printed circuit card; inserting a standoff and placing a spring around each standoff; pressing the chock against the printed circuit card; mounting a first electrical component assembly on a second side of the printed circuit card; placing a package tool having a plurality of springs on a horizontal support so that when the first mounted electrical component assembly is placed inside the package tool the springs of the package tool come into contact with the first electrical component assembly; removing the chock from the printed circuit card such that the springs of the package tool compensate for the weight of the first electrical component assembly inside the package tool; and mounting a second electrical component assembly on the first side of the printed circuit card.

4 Claims, 5 Drawing Sheets

US 7,032,305 B2

METHOD FOR MOUNTING INTEGRATED CIRCUITS ON A PRINTED CIRCUIT CARD

This application is a divisional of application Ser. No. 10/173,751, filed Jun. 19, 2002 now U.S. Pat. No. 6,680,848.

TECHNICAL FIELD

The invention relates to a device for mounting an electrical component on a printed circuit card. The invention particularly applies to integrated circuits whose contact with the connection pads of the printed circuit card is produced by pressure. An integrated circuit provided with a plurality of contact terminals constituting a matrix of flat leads known as an LGA (Land Grid Array) is well adapted to the implementation of the invention, and for that reason will be used as an example to illustrate the invention.

PRIOR ART

Traditionally, an integrated circuit is placed in a package comprising contact terminals. Throughout the description below, the expression "LGA integrated circuit" will be used to designate both an LGA integrated circuit and a circuit placed in a package.

Traditionally, the LGA integrated circuit has two sides, one active and the other inactive. The active side comprises the contact terminals.

Generally, connecting the LGA integrated circuit to the printed circuit card requires stacking a certain number of elements. An insert comprising flexible electric contacts is placed between the LGA integrated circuit and the printed circuit card in order to connect them electrically. Pressure must be exerted on this system in order to produce a good electrical contact. This is done by means of a press plate applied to the non-active side of the LGA integrated circuit. The device is completed by a heat sink that serves to dissipate heat. A variant consists of forming the press plate and the heat sink in one piece. Generally, a thermal joint is inserted between the LGA integrated circuit and the heat sink for a better transfer of energy to the heat sink.

The pressure is applied, for example, by springs pressing on the plate or the plate/heat sink. These springs are generally guided by standoffs attached to the integrated circuit either by inserts or by nuts provided in the printed circuit card.

A first problem raised by this technique is that the current systems do not make it possible to mount integrated circuits, particularly integrated circuits whose electrical contact with the printed circuit card is produced by pressure, on two opposite sides of the printed circuit card.

Another problem is that the inserts or nuts take up a considerable amount of space on the printed circuit card. This constitutes a limitation on the component density. The space occupied by these nuts on the printed circuit card is unacceptable in a world where miniaturization is of utmost importance.

Moreover, the inserts or nuts deform the card in places. The stress produced can cause the traces located near the inserts or nuts to break. It is therefore necessary to limit the trace width, and the routing density is consequently reduced.

THE INVENTION

A first object of the invention is to allow LGA integrated circuits to be mounted on both sides of the printed circuit card.

A second object is to use mounting means whose base does not deform the printed circuit card and takes up as little space as possible, thereby permitting a higher routing density.

A third object of the invention is to retain the ease with which the integrated circuit is mounted on the printed circuit card.

A fourth object is to reduce the financial and time cost of this type of implementation as much as possible.

To this end, the subject of the invention is a device for mounting at least two electrical components on a printed circuit card, the card comprising connection pads on both of its sides, characterized in that the card is traversed by holes for receiving mounting means that extend through the printed circuit card in order to mount the electrical components on opposite sides of the card.

Another subject of the invention is the tool for mounting or removing an electrical component mounted on a printed circuit card, as defined in the mounting device according to the invention, characterized in that it comprises means for exerting pressure on a first electrical component mounted on a first side of the printed circuit card, in order to mount or remove a second electrical component on the opposite side of the printed circuit card.

The invention will be more clearly understood by reading the following description, given as an example and written in reference to the attached drawings.

IN THE DRAWINGS

In order to simplify the description, the same elements in the drawings have the same references.

FIG. 1 is an exploded view in partial perspective illustrating an assembly 1 showing the elements to be stacked on a printed circuit card 2. The printed circuit card includes connection pads (not represented in the figures) on both of its sides.

Figure 1:
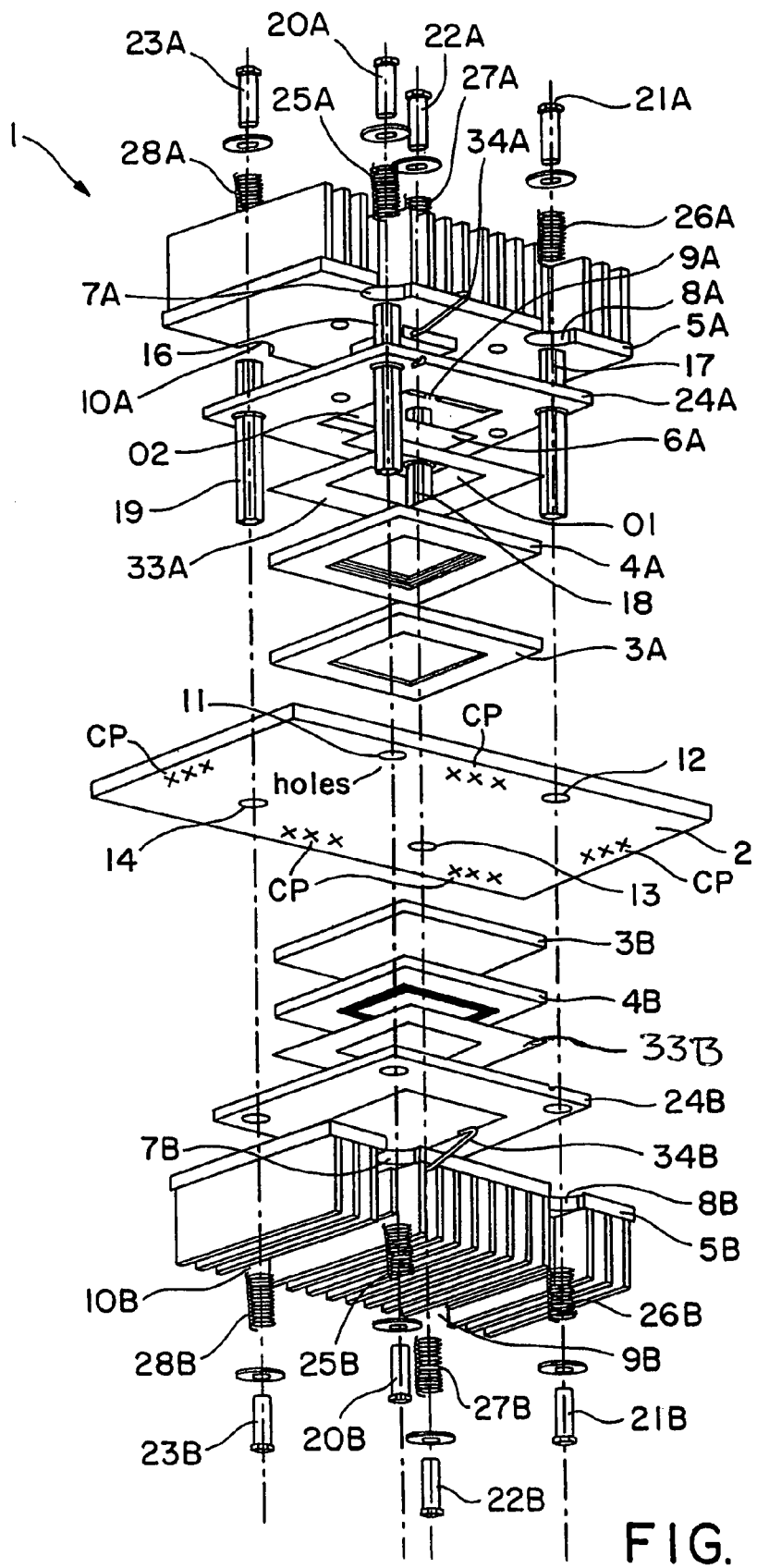
FIG. 1 is an exploded view of the various elements to be stacked in order to connect integrated circuits to two opposite sides of the printed circuit card.

In the example illustrated, an assembly A on one side of the printed circuit card 2 consists of stacking several elements. The elements to be stacked are, in particular:

an insert 3A that includes flexible electrical contacts on both sides is inserted between the LGA integrated circuit and the printed circuit card in order to connect them electrically.

the LGA integrated circuit 4A comprising an active surface, i.e., a surface provided with input-output contact terminals. This active side is in contact with the insert 3A.

a heat sink 5A capable of dissipating the energy produced by the LGA integrated circuit 4A is placed on the non-active surface of the LGA integrated circuit.

a thermal joint 6A inserted between the non-active surface of the LGA integrated circuit 4A and the heat sink 5A so as to constitute a thermal link between these two elements.

Naturally, this assembly constitutes only one embodiment.

In our exemplary embodiment, the heat sink 5A is provided with notches 7A–10A that can freely receive standoffs 16–19 capable of sandwiching together all of the elements mentioned above so as to connect the contact terminals of the LGA integrated circuit 4A with the electrical contacts of the printed circuit card 2A.

The problem, as mentioned above, is that there are no means that make it possible to mount integrated circuits on two opposite sides of the printed circuit card.

One solution consists, for example, of using mounting means that extend through holes 11–14 provided in the printed circuit card 2 to mount integrated circuits 4A and 4B on opposite sides of the card.

The mounting of the various elements to be stacked is symmetrical with respect to the printed circuit card. The assembly B of the second integrated circuit 4B consists of stacking the same elements as before.

Throughout the description below, each element of the same type in the second assembly will be referenced with the same number as the same element located in a symmetrical position relative to the printed circuit card in the first assembly described above. A letter A or B will be used to distinguish the assembly in which the element is stacked.

In our exemplary embodiment, part of the mounting means are standoffs 16–19. The standoffs extend through holes 11–14 in the printed circuit card 2 on each side of the printed circuit card. Each standoff is shared by two integrated circuits 4A and 4B disposed on two opposite sides of the printed circuit card 2 and has the characteristic of not being attached to the printed circuit card.

In the example illustrated, there are four standoffs 16–19. Naturally, there could be any number of them.

Each standoff includes a threaded part on each of its ends capable of receiving a respective screw 20A–23A and 20B–23B. Naturally, the use of such standoffs merely constitutes a preferred embodiment of the invention, and other mounting means that do not use screws are entirely possible.

In the preferred exemplary embodiment of the invention, in order to avoid any rotational movement of the standoffs during mounting or removal, the solution consists of using the standoffs 16–19 in combination with a plate 24A and 24B on each side of the printed circuit card. This plate 24A and 24B is equipped with holes for the insertion of the standoffs. The function of the holes is specifically to prevent any rotational movement of the standoffs 7A–7D.

Figure 2:
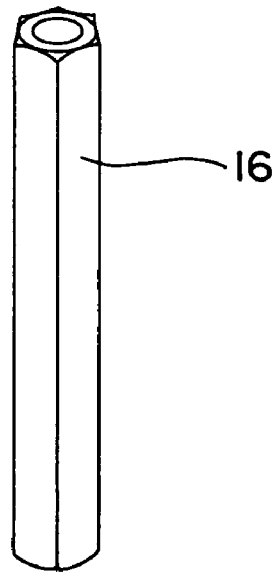
FIG. 2 is a view in perspective of a part of exemplary illustration of an element of the mounting means.

In our exemplary embodiment, the cross section of the holes and the standoffs is hexagonal. FIG. 2 is a view in perspective of a standoff showing its hexagonal cross section. Naturally, this example is not in any way limiting and any other cross section that prevents a rotational movement of the standoffs is possible.

Preferably, an electrical insulant 33A and 33B is inserted between each plate 24A and 24B and the respective integrated circuit 4A and 4B. The insulant 33A and the plate 24A include respective openings 01 and 02 capable of allowing contact between the circuit 4A and 4B and the respective heat sink 5A and 5B. A thermal joint 6A covers the integrated circuit 4A itself for better dissipation of the heat toward the heat sink part 5A.

In our exemplary embodiment, each plate 24A and 24B is not only a means for rotationally locking the standoffs, but also exerts uniform pressure on the assembly during mounting.

Preferably, each plate 24A and 24B is located in the stack between the heat sink 5A and 5B and the integrated circuit 4A and 4B, respectively.

Naturally, the plate could be replaced by any other means that ensures both the rotational locking of the standoffs and a uniform pressure during mounting or removal. For example, another variant consists of equipping the base of each heat sink 5A and 5B with holes having the same function as a plate. The holes simultaneously ensure the rotational locking of the standoffs and the base of the heat sink ensures uniform pressure during mounting or removal.

The force of the pressure to be exerted on each assembly A and B should be calibrated and brought to bear with great care. One solution consists of equipping each standoff with springs (25A, 26A, 27A, 28A) for assembly A and springs (25B, 26B, 27B, 28B) for assembly B in order to apply a force F required to establish electrical contact between each integrated circuit 4A and 4B and the printed circuit card 2. In the example illustrated, the springs (25A, 26A, 27A, 28A) of assembly A and springs (25B, 26B, 27B, 28B) of assembly B press against the respective plate 24A and 24B. Preferably, the standoffs 16–19 are equipped with springs with the same stiffness coefficient K in order to exert a uniform pressure. During the screwing process, the head of each screw 20A–23A and 20B–23B compresses the respective spring, possibly via a washer, in order to drive the respective integrated circuit 4A, 4B in its movement, so as to connect it to the printed circuit card 2. The unscrewing of each screw 20A–23A and 20B–23B also has the effect of decompressing the respective spring (25A, 26A, 27A, 28A) and (25B, 26B, 27B, 28B) so as to disconnect the respective integrated circuit 4A and 4B from the printed circuit card 2.

In our exemplary embodiment, the chosen length of the screw is such that once the spring is decompressed, the respective screw remains engaged in the threading of the respective standoff.

Figure 3:
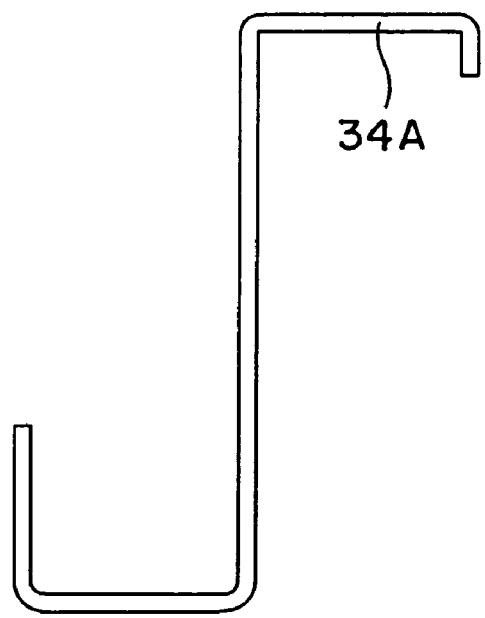
FIG. 3 is a view of an exemplary embodiment of a means for securely stacking the aforementioned various elements.
Figure 4:
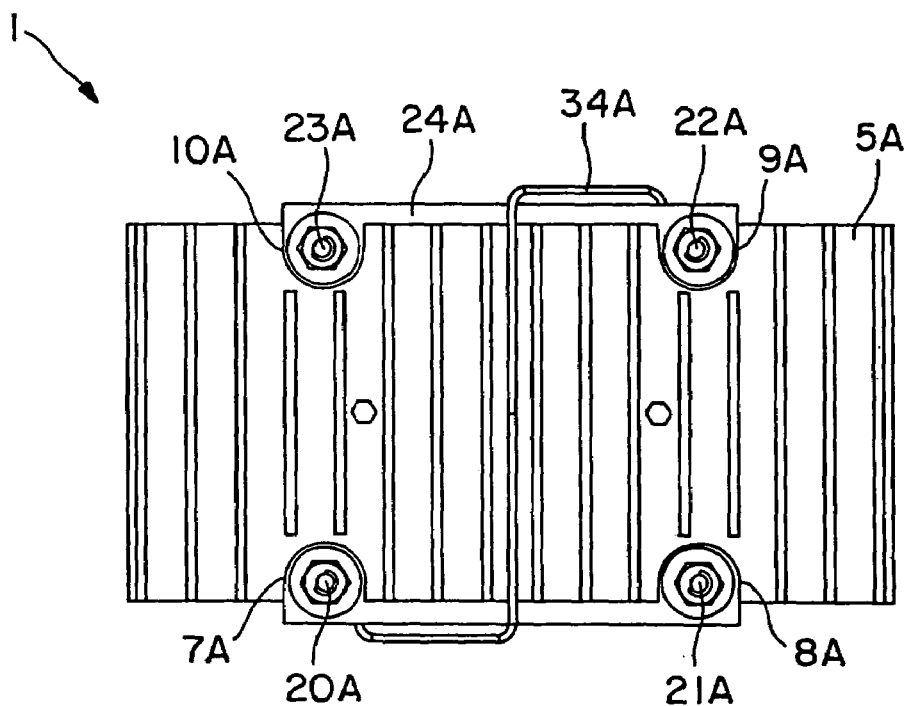
FIG. 4 is a top view of the assembly produced according to an exemplary embodiment of the invention.

The springs (25A, 26A, 27A, 28A) and (25B, 26B, 27B, 28B) do not press against the heat sinks since the necessary pressure applied in order to ensure good electrical contact with the contacts is different from the pressure required for good thermal contact between an integrated circuit 4A and 4B and the respective heat sink 5A and 5B. One solution consists of joining these two components (heat sink and plate), for example by means of at least one respective twist clip 34A and 34B. A twist clip is represented in FIG. 3. The function of a twist clip is to apply a force that is independent of the pressure force F to be applied for the electrical contacts. This constitutes a means for making the different pressure forces to be applied independent of one another. The two ends of each twist clip 34A and 34B press on a support surface of the respective heat sink 5A and 5B and the body presses on an opposing support surface of the plate.

Figure 5:
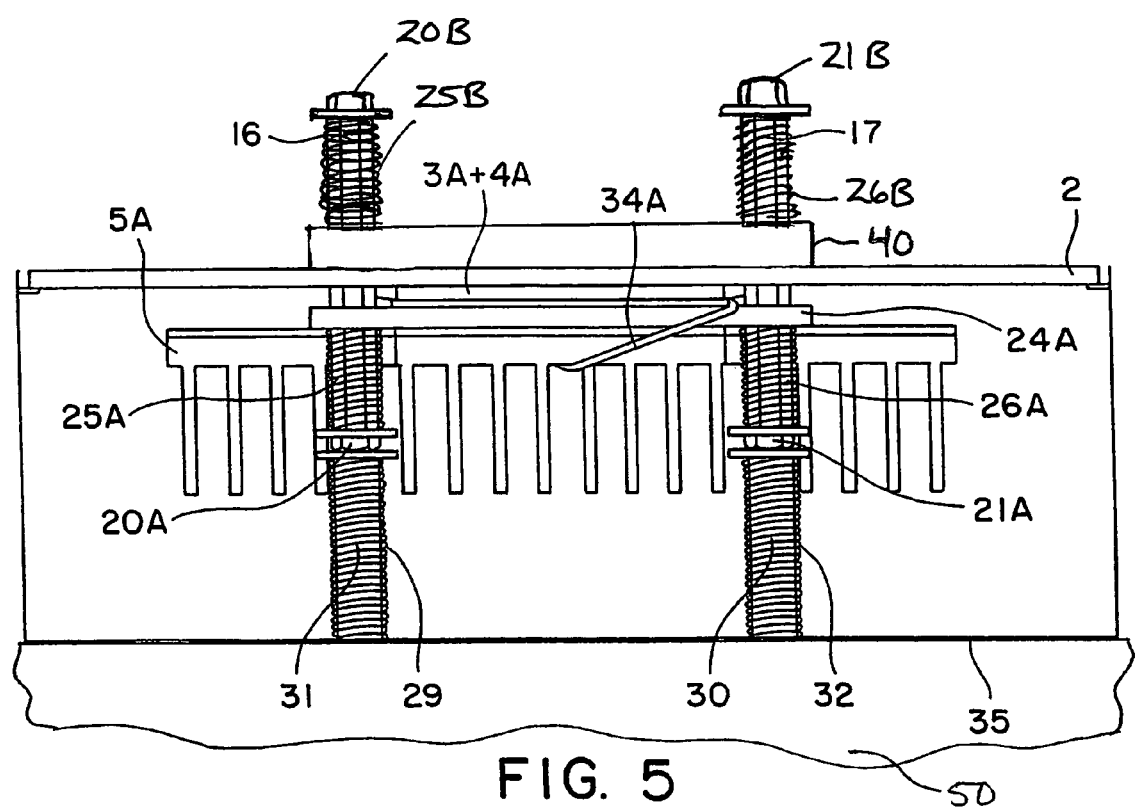
FIG. 5 is a view of a tool for mounting or removing an LGA integrated circuit on the printed circuit card.

As a precaution, the integrated circuits 4A and 4B are mounted one after the other. The mounting of the first integrated circuit 4A is done by means of a chock 40, as shown in FIG. 5, that replaces the second assembly, which has not yet been mounted. This chock 40 is representative of the thickness of an assembly.

After the first integrated circuit 4A has been mounted, the chock 40 is removed. The standoffs being capable of moving in a direction perpendicular to the printed circuit card, the mounting of the second integrated circuit 4B to the other side of the printed circuit card is done by means of a tool 35. FIG. 5 is a view of an exemplary embodiment of such a tool.

After the first integrated circuit 4A has been mounted, the chock is removed. The standoffs being capable of moving in a direction perpendicular to the printed circuit card, the mounting of the second integrated circuit 4B to the other side of the printed circuit card is done by means of a tool 35. FIG. 5 is a view of an exemplary embodiment of such a tool.

During the mounting, or removal followed by a remounting, of this second integrated circuit 4B, the tool 35, i.e., a package tool 35, is placed, for example, on a horizontal support 50, as shown in FIG. 5, the shafts 29–30 being directed upward. The printed circuit card 2 is placed on this package tool 35 in order to insert the assembly A created into the package tool 35, the axes of the standoffs 16–19 coinciding with the axes of the shafts 29–30 of the package tool 35. As shown in FIG. 5, when the printed circuit card 2 is placed on the package tool 35, the chock 40 is accessible for removal prior to the installation of the second integrated circuit 4B.

Preferably, the package tool 35 is attached to the printed circuit card for better handling. The method of attachment is arbitrary.

The springs 31–32 of the package tool 35 come into contact with the heads of the screws (20A–23A) of the assembly A. Inside the package tool 35, each spring 31–32 exerts a force that compensates for the weight of this assembly, thereby preventing any translational movement of the standoffs 16–19 perpendicular to the printed circuit card 2.

The springs 31–32 of the package 35 come into contact with the heads of the screws (20A–23A) of the assembly A. Inside the package 35, each spring 31–32 exerts a force that compensates for the weight of this assembly, thereby preventing any translational movement of the standoffs 16–19 perpendicular to the printed circuit card 2.

The stack is symmetrical on each side of the printed circuit card. During the mounting of the assembly B, the standoffs being rotationally and translationally locked, the screwing or unscrewing is done without any problem.

Let's assume that the assembly A is inside the package in the same position as described above and that the assembly B is fully assembled. If it is necessary to remove the assembly B, the screws 20B–23B are removed. During the removal of the screws from the assembly B, even though the springs of the assembly B are decompressed, the package itself maintains enough pressure on the springs of the assembly A to ensure good electrical contact between the integrated circuit 4A and the printed circuit card 2.

The springs of the package make it possible to decompress the springs (25A, 26A, 27A, 28A) and (25B, 26B, 27B, 28B) on both sides of the printed circuit card 2. The unscrewing, for example, of the screws 20B–23B on one side of the printed circuit card decompresses the respective springs 25B–28B of the assembly B as well as the springs 25A–28A of the assembly A. The springs of the package therefore ensure the equality of the pressure on both sides of the printed circuit card for a certain amount of time. Preferably, the stiffness coefficient of the springs of the package is chosen so that when the forces cancel each other out and an equilibrium is reached, there is sufficient electrical contact with the integrated circuit 4A.

Figure 6:
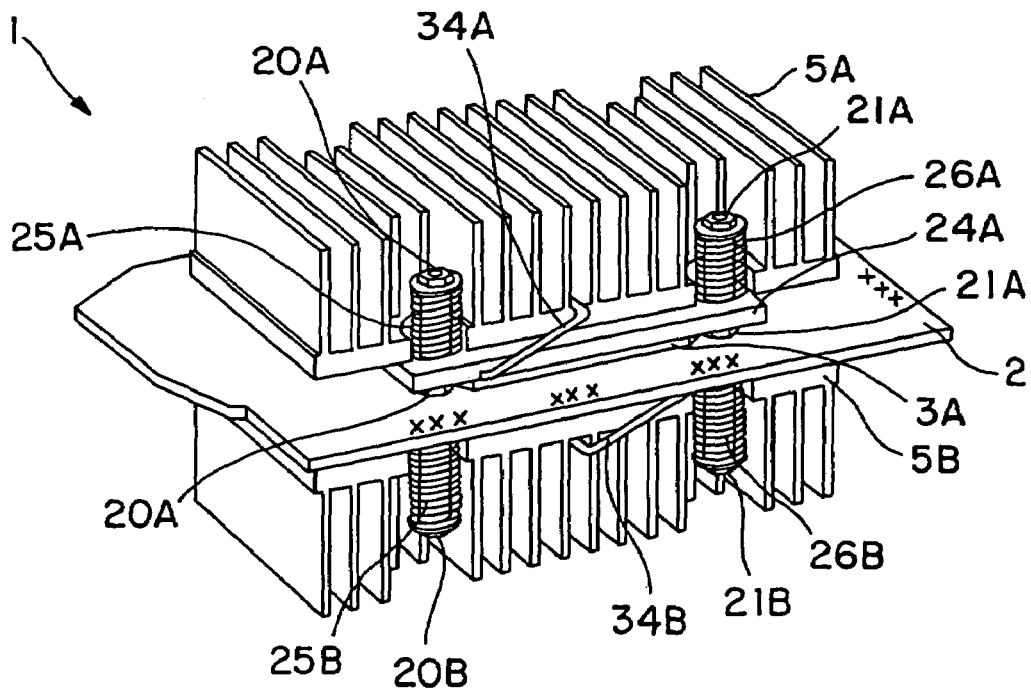
FIG. 6 is a view of the assembly produced, showing the mounting of the integrated circuits on two opposite sides of the printed circuit card.

The result of the preceding operations produces the assembly visible in FIG. 6, which represents the completed assembly.

The method for mounting an integrated circuit 4A or 4B, beginning with a printed circuit card 2 that is empty of components, can be implemented in several steps. It is noted that the direction in which these steps are performed is entirely arbitrary. The direction of execution chosen is the one that seems most appropriate and easiest for one skilled in the art.

Let's assume that the integrated circuit 4A will be mounted first, followed by the integrated circuit 4B.

Figure 7:
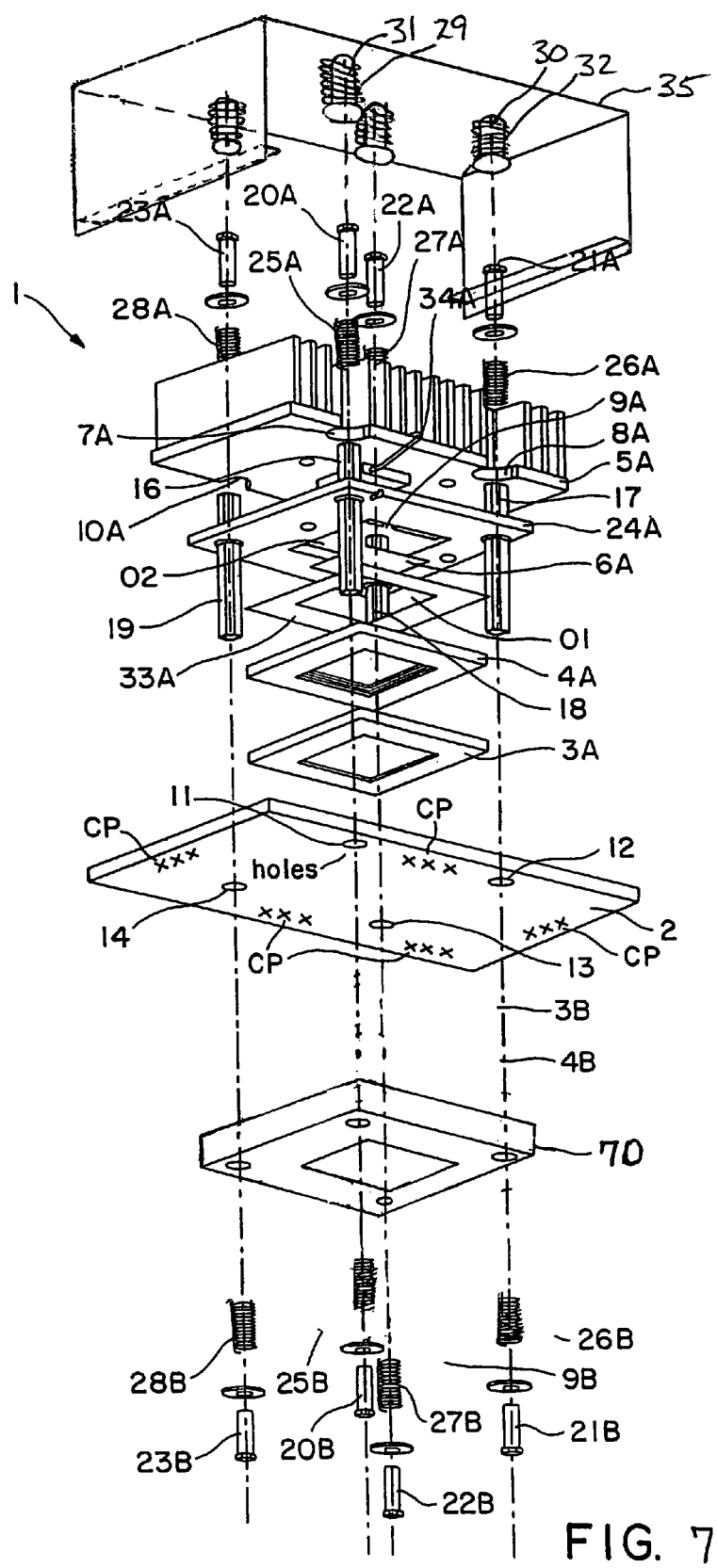
FIG. 7 is an exploded view of the various elements to be stacked in the order in which they connect to one side of the printed circuit card using a chock.

A preliminary step consists of inserting, through the holes 11–14 provided for this purpose in the printed circuit 2, and on the opposite side of the printed circuit card onto which the integrated circuit 4A is to be mounted, a center chock 70, as shown in FIG. 7. This center chock 70 is equivalent in size to a plate 24A or 24B, but with a thickness representative of the thickness of an assembly. The springs are placed around the standoffs and the center chock 70 is pressed against the printed circuit card 2 by means of screws 20B–23B.

A preliminary step consists of inserting, through the holes 11–14 provided for this purpose in the printed circuit 2, and on the opposite side of the printed circuit card onto which the integrated circuit 4A is to be mounted, a center chock. This chock is equivalent in size to a plate 24A or 24B, but with a thickness representative of the thickness of an assembly. The springs are placed around the standoffs and the chock is pressed against the printed circuit card 2 by means of screws 20B–23B.

Step E2

A second step consists of placing the insert 3A on the printed circuit card so that the electrical contacts coincide.

Step E3

A third step consists of placing the integrated circuit 4A on the insert 3A so that the pins of the circuit 4A coincide with the electrical contacts of the insert 3A.

Step E4

Preferably, prior to the application of pressure by means of the plate 24A, and in order to make mounting easier, the following two sub-steps are performed:

The electrical insulant 33A is placed on the integrated circuit 4A in order to electrically insulate the plate 24A from the integrated circuit 4A.

The thermal joint 6A is put into place.

These two sub-steps can be performed in either direction.

Step E5

A fifth step consists of placing the plate 24A on the elements stacked during steps E2 through E4. The plate 24A is guided via its holes by the standoffs 16–19.

Step E6

A sixth step consists of inserting a spring 25A–26A on each standoff 16–19.

Step E7

A seventh step consists of putting the heat sink 5A in place, allowing the standoffs and springs to pass through the notches 7A–10A in the heat sink provided for this purpose.

Step E8

When the stacking is finished, an eighth step consists of screwing the screws 20A–23A into the respective standoffs 16–19 in order to exert pressure so that the various electrical contacts are established.

At this stage, the integrated circuit 4A is mounted on the printed circuit card 2.

Step E9

Next, the assembly A is placed inside the package 35 so that the springs 31–32 of the containing package come into contact with the heads of the screws of the assembly A.

Next, as shown in FIG. 7, the assembly A is placed inside the package tool 35 so that the springs 31–32 of the package tool 35 come into contact with the heads of the screws of the assembly A, which results in the configuration shown in FIG. 5.

The next step consists of removing the chock inserted in step E1. During the removal of the chock, the springs of the package 35 exert a force that compensates for the weight of the assembly A inside the package 35 and thus prevents the standoffs and the assembly A from moving in a direction perpendicular to the plane of the printed circuit card.

The next step consists of removing the center chock 70 inserted in step E1. During the removal of the center chock 70, the springs 31–32 of the package tool 35 exert a force that compensates for the weight of the assembly A inside the package tool 35 and thus prevents the standoffs and the assembly A from moving in a direction perpendicular to the plane of the printed circuit card 2.

Now let's assume that both of the integrated circuits 4A and 4B are attached to the printed circuit card 2 and that we want to remove the integrated circuit 4B.

For a removal procedure, followed by a remounting of an integrated circuit onto a printed circuit card already equipped with LGA integrated circuits on both sides, the following operations are performed.

Step F1

The assembly A is placed inside the tool so that the springs 31, 32 of the latter come into contact with the heads of the screws of the assembly A.

The assembly A is placed inside the package tool 35 so that the springs 31, 32 of the latter come into contact with the heads of the screws of the assembly A.

The screws 20B–23B are then unscrewed so as to release the pressure of the respective springs 25B–28B. At the end of the operation, the springs 31, 32 of the package exert a force that compensates for the weight of the assembly A inside the package 35 and thus prevents the standoffs and the assembly A from moving in a direction perpendicular to the plane of the printed circuit card.

The screws 20B–23B are then unscrewed so as to release the pressure of the respective springs 25B–28B. At the end of the operation, the springs 31, 32 of the package exert a force that compensates for the weight of the assembly A inside the package tool 35 and thus prevents the standoffs and the assembly A from moving in a direction perpendicular to the plane of the printed circuit card.

All of the stacked elements of the assembly B (heat sink, plate, insert, etc.) are successively removed.

Step F4:

The next step consists of remounting the second integrated circuit 4B to the side of the printed circuit card from which the standoffs extend and performing the mounting described according to steps E2 through E8 again.

In general, the invention relates to a device 1 for mounting at least two electrical components 4A and 4B on a printed circuit card 2, the card comprising connection pads on both of its sides, characterized in that the card 2 is traversed by holes 11–14 for receiving mounting means that extend through the printed circuit card in order to mount the electrical components 4A, 4B on opposite sides of the card. We have seen that the mounting means exert equal pressure on both sides of the printed circuit card (2).

In our exemplary embodiment, the mounting means are standoffs 16–19, each standoff comprising on both of its ends a threaded part capable of receiving a screw for the electrical components 4A, 4B on opposite sides of the printed circuit card. We have seen that the use of such standoffs merely constitutes a preferred embodiment of the invention, and that other mounting means that do not use screws are entirely possible.

The mount being symmetrical, and the mounting being performed by means of screws, it is necessary to prevent any rotational movement of the standoffs during the screwing or unscrewing operation. One possible solution consists of using a plate 8 on each side of the printed circuit card, said plate 8 including notches traversed by the standoffs, the shape of the holes and the standoffs preventing any rotational movement of the standoffs for mounting and removal.

We have also seen that the electrical connection must be produced with great precision. In our exemplary embodiment, we have chosen to use, on each side of the printed circuit card 2, springs 25A–28A and 25B–28B inserted between the head of each respective screw 20A–23A and 20B–23B and the respective plate 24A, 24B, one of the ends of the spring pressing against the respective plate 24A, 24B. Preferably, on each side of the printed circuit card, each standoff 16–19 is equipped with a spring with the same stiffness coefficient in order to exert a uniform pressure capable of establishing electrical contact between each electrical component 4A, 4B and the printed circuit card 2.

We have also seen that various pressure forces must be applied to certain elements of an assembly. In our example, on each side of the printed circuit card 2, a heat sink 5A and 5B is mounted on the respective plate 24A and 24B, and a twist clip 27A, 27B connects the respective heat sink 5A, 5B and plate 24A, 24B so as to exert on this assembly a pressure force independent of the pressure force produced by the springs.

We have also seen that the present invention is very well adapted to integrated circuits whose electrical contact with the printed circuit card is produced by pressure.

The mounting or removal of the assemblies requires the use of a particular tool. This tool 35 comprises means for exerting pressure on a first electrical component 4A mounted on a first side of the printed circuit card, in order to mount or remove a second electrical component 4B on the opposite side of the printed circuit card 2.

In our exemplary embodiment, the means for exerting pressure are springs (31, 32) whose axis coincides with the axis of the standoffs (16–19).

Hence, it is clear that the present invention offers many advantages. The device of the invention makes it possible to mount integrated circuits on two opposite sides of the printed circuit card, while allowing independent mounting and removal of each of the two integrated circuits, thanks to the tool 35. The passage of the standoffs through the printed circuit card avoids having to use nuts or inserts. Thus, the areas that are off-limits to routing are limited to the area near the hole. Furthermore, it is clear that the combined use of the standoffs and a plate makes it possible to apply the pressure required for good symmetric electrical contact on both sides of the printed circuit card during the mounting and removal operations.

The invention claimed is:

1. A method of mounting electrical component assemblies on opposite sides of a printed circuit card, said printed circuit card being provided with a plurality of through holes and having connection pads on a both sides, comprising:
   inserting a chock on a first side of the printed circuit card, said chock having a thickness about equal to a thickness of one of two electrical component assemblies to be mounted on said printed circuit card and said chock having a plurality of through holes that correspond to the plurality of through holes in said printed circuit card;

inserting a standoff through each through hole in said printed circuit card and said chock and placing a spring around each standoff to be used to press said chock against said printed circuit card;

pressing the chock against the printed circuit card;

mounting a first electrical component assembly on a second side of the printed circuit card;

placing a package tool having a plurality of springs on a horizontal support;

placing the first electrical component assembly inside the package tool so that the springs of the package tool come into contact with the first electrical component assembly;

removing the chock from the first side of said printed circuit card such that springs of the package tool exert a force that compensates for the weight of the first electrical component assembly inside the package tool; and mounting a second electrical component assembly on the first side of the printed circuit card.

2. The method of claim 1, wherein the first and second electrical component assemblies are integrated circuits.

3. The method of claim 1, wherein said chock is pressed against the printed circuit card through screws in the standoffs.

4. The method of claim 1, wherein said mounting a first electrical component assembly comprises:

placing an insert having electrical contacts on the printed circuit card so that electrical contacts of the insert coincide with electrical contacts of the second side of the printed circuit card;

placing an electrical component having pins on the insert so the pins of the component coincide with electrical contacts of the insert;

placing a plate on the electrical component and the insert;

placing a heat sink on the plate, electrical component and insert; and exerting pressure on the heat sink, plate, electrical component and insert to mount the assembly comprising the heat sink, plate, electrical component and insert to the printed circuit card.

* * * * *